(12) United States Patent
Vera Villarroel et al.

(10) Patent No.: US 10,965,252 B2
(45) Date of Patent: Mar. 30, 2021

(54) BROADBAND DRIVER WITH EXTENDED LINEAR OUTPUT VOLTAGE

(71) Applicant: Elenion Technologies, LLC, New York, NY (US)

(72) Inventors: Ariel Leonardo Vera Villarroel, Union City, NJ (US); Mohamed Megahed Mabrouk Megahed, Corvallis, OR (US); Alexander Rylyakov, Staten Island, NY (US)

(73) Assignee: Elenion Technologies, LLC

( * ) Notice: Subject to any disclaimer, the term of this patent is extended or adjusted under 35 U.S.C. 154(b) by 0 days.

(21) Appl. No.: 16/916,196

(22) Filed: Jun. 30, 2020

(65) Prior Publication Data

US 2020/0336109 A1 Oct. 22, 2020

Related U.S. Application Data

(63) Continuation of application No. 16/173,499, filed on Oct. 29, 2018, now abandoned.

(51) Int. Cl.
*H03F 1/02* (2006.01)
*H03F 3/45* (2006.01)

(52) U.S. Cl.
CPC ....... *H03F 1/0222* (2013.01); *H03F 3/45076* (2013.01); *H03F 2200/462* (2013.01); *H03F 2200/471* (2013.01); *H03F 2203/45154* (2013.01)

(58) Field of Classification Search
CPC ..................................................... H03F 1/0222
See application file for complete search history.

(56) References Cited

U.S. PATENT DOCUMENTS

| | | | | |
|---|---|---|---|---|
| 7,248,115 B2 * | 7/2007 | Nishimura | ............... | H03F 3/72 330/253 |
| 2002/0050861 A1 * | 5/2002 | Nguyen | ............. | H03F 3/45197 330/254 |
| 2006/0238243 A1 * | 10/2006 | Tsuchi | ............... | H03F 3/45183 330/51 |
| 2008/0119154 A1 * | 5/2008 | Nam | .................... | H03G 1/0029 455/253.2 |
| 2013/0021100 A1 * | 1/2013 | Fanous | ............... | H03G 1/0029 330/254 |
| 2015/0263674 A1 * | 9/2015 | Pulijala | .................. | H03F 3/211 330/295 |
| 2016/0142026 A1 * | 5/2016 | Kim | .................... | H03F 3/45197 330/291 |

* cited by examiner

*Primary Examiner* — Patricia T Nguyen
(74) *Attorney, Agent, or Firm* — Stratford Managers Corporation

(57) ABSTRACT

Modern modulator drivers must be capable of delivering a large output voltage into a tens of ohms modulator, while minimizing the amount of distortion added by the driver. The driver should deliver the output voltage without exceeding a maximum distortion while minimizing the DC power consumption. Accordingly, a modulator driver includes a final stage amplifier with auxiliary transistors that turn on when the conventional differential pair of transistors approaches their maximum voltage of the linear region of their transfer function, thereby providing a more linear transfer function, in particular at large input voltages.

20 Claims, 9 Drawing Sheets

BROADBAND DRIVER WITH EXTENDED LINEAR OUTPUT VOLTAGE

CROSS REFERENCE TO RELATED APPLICATION

This application is a continuation of U.S. patent application Ser. No. 16/173,499, filed Oct. 29, 2018, now allowed, which is hereby incorporated by reference in its entirety.

TECHNICAL FIELD

The present invention relates to a driver for an optical transmitter, and in particular to a broadband driver with extended linear output voltage.

BACKGROUND

Information is transmitted in an optical channel using optical modulation. In a transmitter, the information in the form of an electrical signal is used to modulate an optical signal, which may be modulated in amplitude, phase, polarization or a combination thereof. The modulation of the optical signal is done using a transducer that converts the electrical signal to the modulated optical signal, e.g. Mach-Zehnder modulator. The transducer uses both an electrical and an optical input signal, by modifying the optical input according to the electrical signal, such the optical output signal contains the information to be transmitted. Typically, the electrical input signal is a voltage.

Information is processed locally in the electrical domain, and then for optical transmission the electrical signal is mapped using a modulation scheme, e.g. 64 QAM. The resulting electrical signal is amplified using a voltage-to-voltage amplifier called a driver, since its output "drives" the electro-optical modulator e.g. Mach-Zehnder modulator. The optical modulator usually requires a voltage with low distortion and several volts of magnitude.

To increase optical channel capacity complex modulation schemes may be used, e.g. quadrature modulation. Therefore, the amplitude and phase of the electrical signal have constraints that translate to large voltage amplitude, e.g. several volts, and high linearity, e.g. low distortion. A driver circuit generates the electrical signal used by the modulator. Large output voltages, high linearity, and low power consumption are the constraints that make the driver one of the most challenging components to design in an optical transmitter Typically, the driver input signal has been processed, e.g. by the manipulation of magnitude and phase, to maximize the channel capacity. In order to reduce power consumption, all processing may be done with low power circuits, which limit the maximum voltage magnitude that can be provided to the driver. Accordingly, the function of the driver is to amplify the incoming signal to values required by the modulator while adding minimum distortion.

The driver circuit typically includes several blocks, for example: an input buffer, one or more variable gain amplifiers (VGA), and an output or driver stage. The driver's last stage must deliver the output voltage. In a current-mode logic design, the driver output voltage equals the last stage current times the modulator's impedance. The modulator's impedance may be a value in the order of tens of ohms; however, if several volts of output voltage is required by the modulator, the last stage current must be in the order of tens of milliamps.

The requirements for the output voltage necessitates that the transistors in the driver conduct current ranging from the full current in the final stage to almost no current, i.e. the transistors steer the last stage current in the differential output. When the transistors operate under these constrains, they operate almost as switches turning ON and OFF. Therefore, they are operating in their most non-linear operation mode, and they contribute to the generation of undesired distortion.

An alternative is to trade-off power consumption for linearity. Increasing the current handled by the last stage enables the output transistors to operate in a linear region, for example using a differential pair with increased bias current and increased degeneration. However, this alternative increases the power consumption of the driver.

An object of the present invention is to overcome the shortcomings of the prior art by extending the linear output voltage range of a driver, and reducing the power consumption compared to other solutions with comparable output voltage and linearity.

SUMMARY OF THE INVENTION

Accordingly, the present invention relates to a transmitter driver for preparing input electrical signals for output to a modular comprising:

first and second inputs for inputting first and second input electrical signals;

a buffer stage for shifting a reference of the first and second input electrical signals;

an amplifier stage receiving the first and second input electrical signals, including:

first and second differential pair transistors forming a differential pair connected to the buffer stage;

first and second outputs connected to second terminals of the first and second differential pair transistors respectively for outputting first and second output electrical signals; and first and second auxiliary transistors connected to the second terminals of the first and second differential pair transistors, wherein the first and second auxiliary transistors are capable of turning on when the first and second input electrical signals exceed a maximum input voltage of a linear region of a transfer function of the first and second differential transistors for increasing the first and second output electrical signals, thereby increasing a linear region of a transfer function of the amplifier stage.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
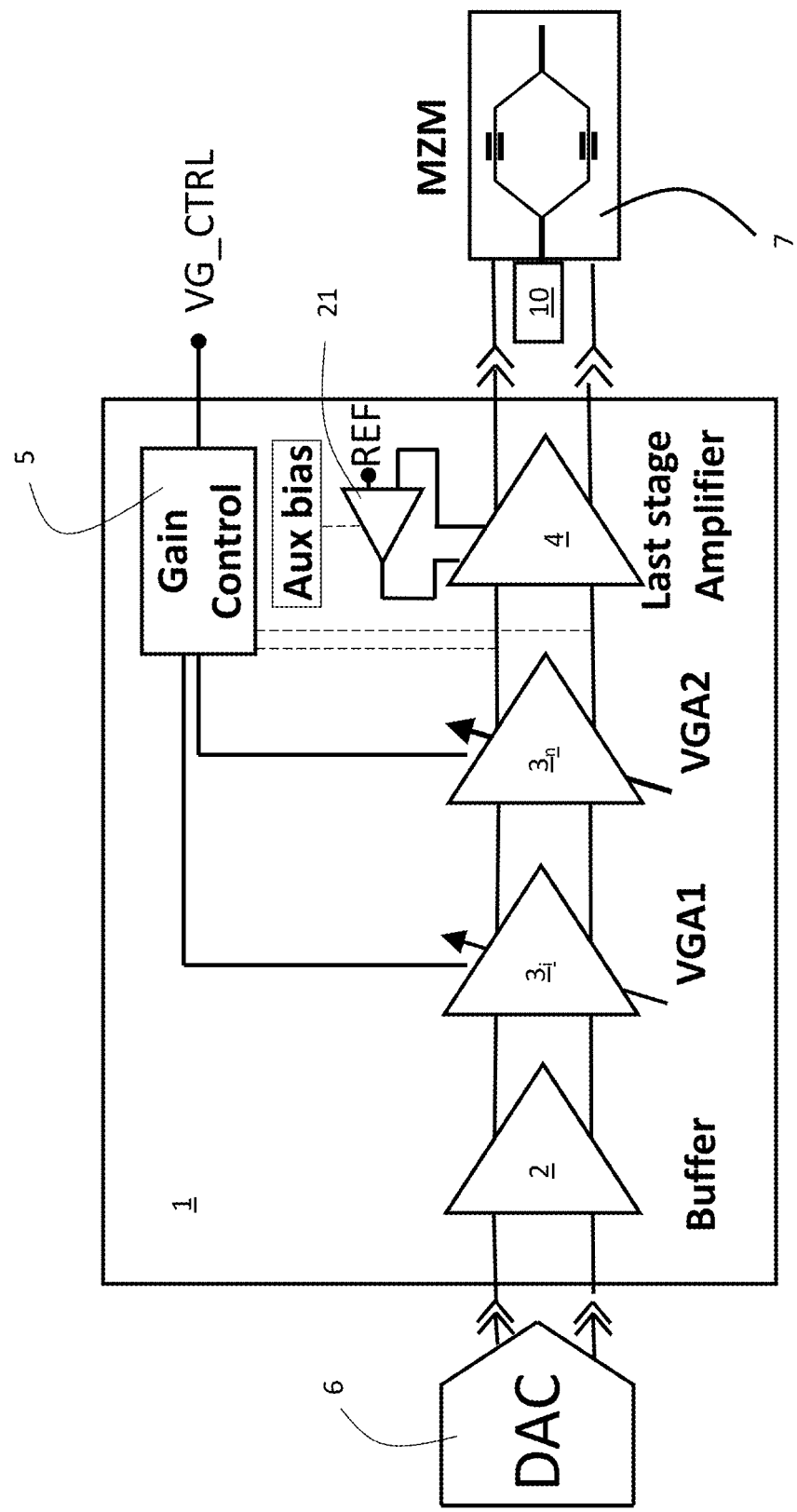
FIG. 1 is an schematic diagram of a transmitter in accordance with an embodiment of the present invention.

While the present teachings are described in conjunction with various embodiments and examples, it is not intended that the present teachings be limited to such embodiments. On the contrary, the present teachings encompass various alternatives and equivalents, as will be appreciated by those of skill in the art.

A driver circuit 1, in accordance with the present invention comprises an input buffer 2, one or more variable gain amplifiers (VGA) $3_i$ to $3_n$, and a last stage amplifier 4. The last stage amplifier 4 is responsible to deliver the current required to generate a desired output voltage. A gain controller 5 may be included in the driver circuit 1 or external thereto for sending gain control signals to one or each of the VGA's $3_i$ to $3_n$. The gain controller 5 may receive a gain control signal VG_CTRL from an external source and/or the gain controller 5 may be part of a feedback loop, which compares the levels of the electrical signals from a tap (shown in broken lines) to a desired level and controls the gain of the VGA's $3_i$ to $3_n$ accordingly. The driver circuit 1 may be embedded between a digital to analog converter (DAC) 6 for generating an analog signal, which has been digitally processed, and an electro-optical transducer 7, e.g. a Mach-Zehnder modulator. A transmitter may comprise the driver circuit 1 in combination with the electro-optical transducer 7, and a light source, e.g. a laser, 10. Accordingly, the light source 10 generates an optical signal, which may then be modulated using the first and second output electrical signals from the driver circuit 1.

If properly designed, the distortion introduced by the driver circuit 1 may be mainly generated in the last stage amplifier 4. Design and optimization of the last stage amplifier 4 is key to obtain good linearity. The proposed solution description is based in a SiGe Bipolar Transistor technology, i.e. first base terminal, second collector terminal, and third emitter terminal; however, the principle presented may be applied to CMOS or other technologies, e.g. first gate terminal, second drain terminal, and third source terminal.

Figure 2:
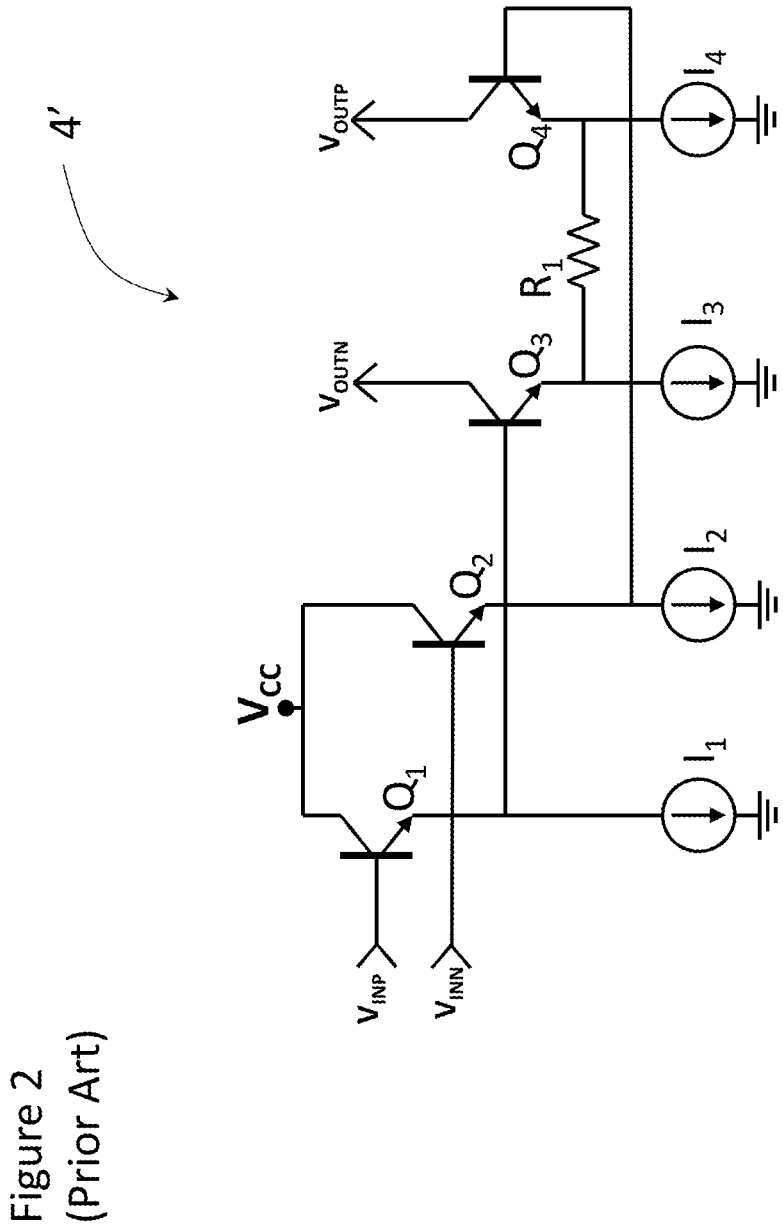
FIG. 2 is a schematic diagram of a conventional final stage driver.
Figure 3:
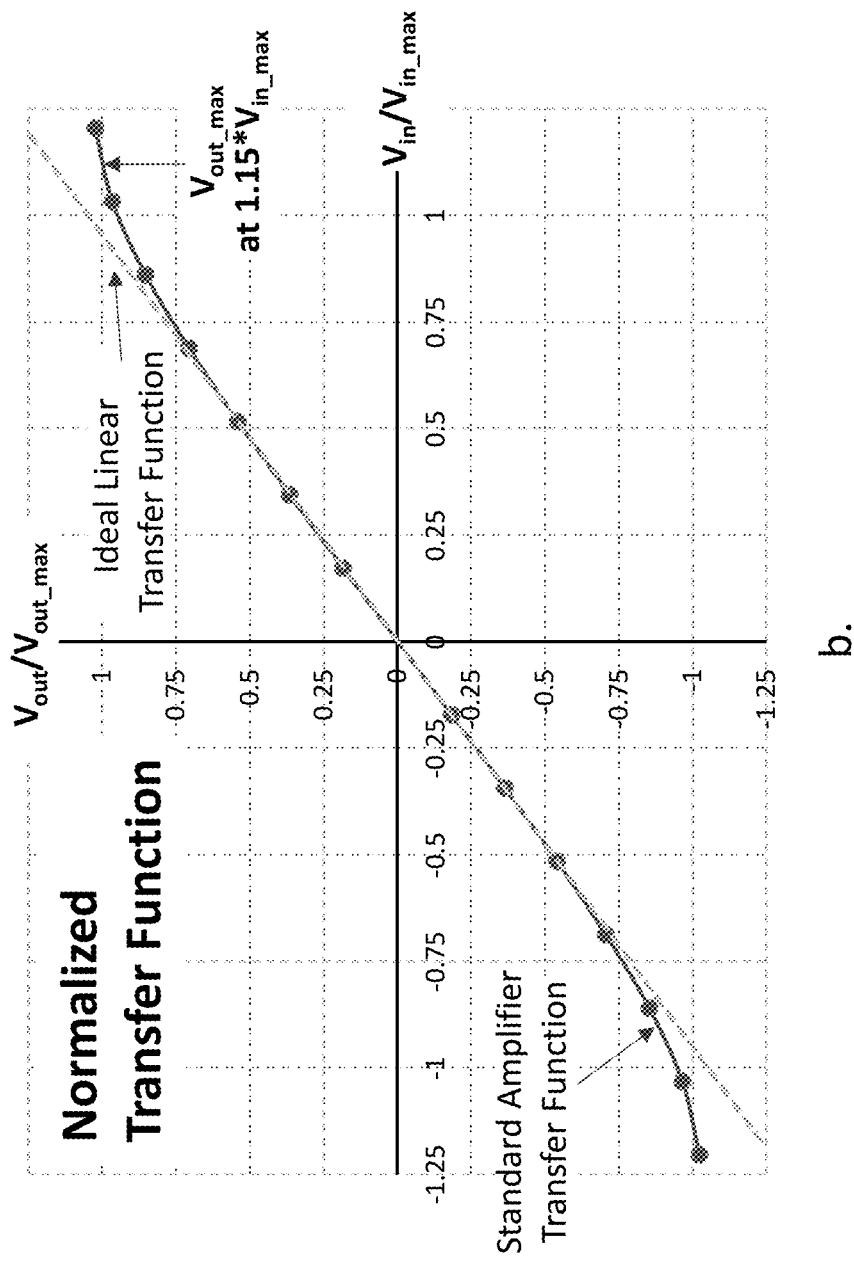
FIG. 3 is a graph of a normalized transfer function of the driver of FIG. 2.

With reference to FIG. 2, a conventional driver circuit with differential output voltage may comprise a differential pair of transistors $Q_3$ and $Q_4$ as the last stage amplifier 4'. In the last stage amplifier 4', the linear range of the differential pair $Q_3$ and $Q_4$ may be limited by their hyperbolic transfer function (See FIG. 3). FIG. 3 illustrates the differential pair transfer function and an ideal linear transfer function. Therefore, nonlinearities increase once the differential pair input voltage exceeds the differential pair linear region, e.g. outside the linear region may be defined as $V_{in} < -0.75\ V_{in\_max}$ and $V_{in} > 0.75\ V_{in\_max}$. $V_{in\_max}$ being the target or desired input voltage that generates the target or desired output voltage $V_{out\_max}$, required by the subsequent modulator 7. Accordingly, in the illustrated conventional driver circuit, in order to reach the target output voltage ($V_{out\_max}$) $V_{in}$ must equal $1.15*V_{in\_max}$, since $V_{in\_max}$ falls outside the linear region of the transfer function of the differential pair $Q_3$ and $Q_4$. The linear input voltage range of the differential pair $Q_3$ and $Q_4$ may be extended by using degeneration resistor(s) $R_1$, however, the extended linear range comes at the expense of lower gain. Further extension of the linear range requires increase of the final stage current and degeneration, i.e. higher power consumption.

Figure 4:
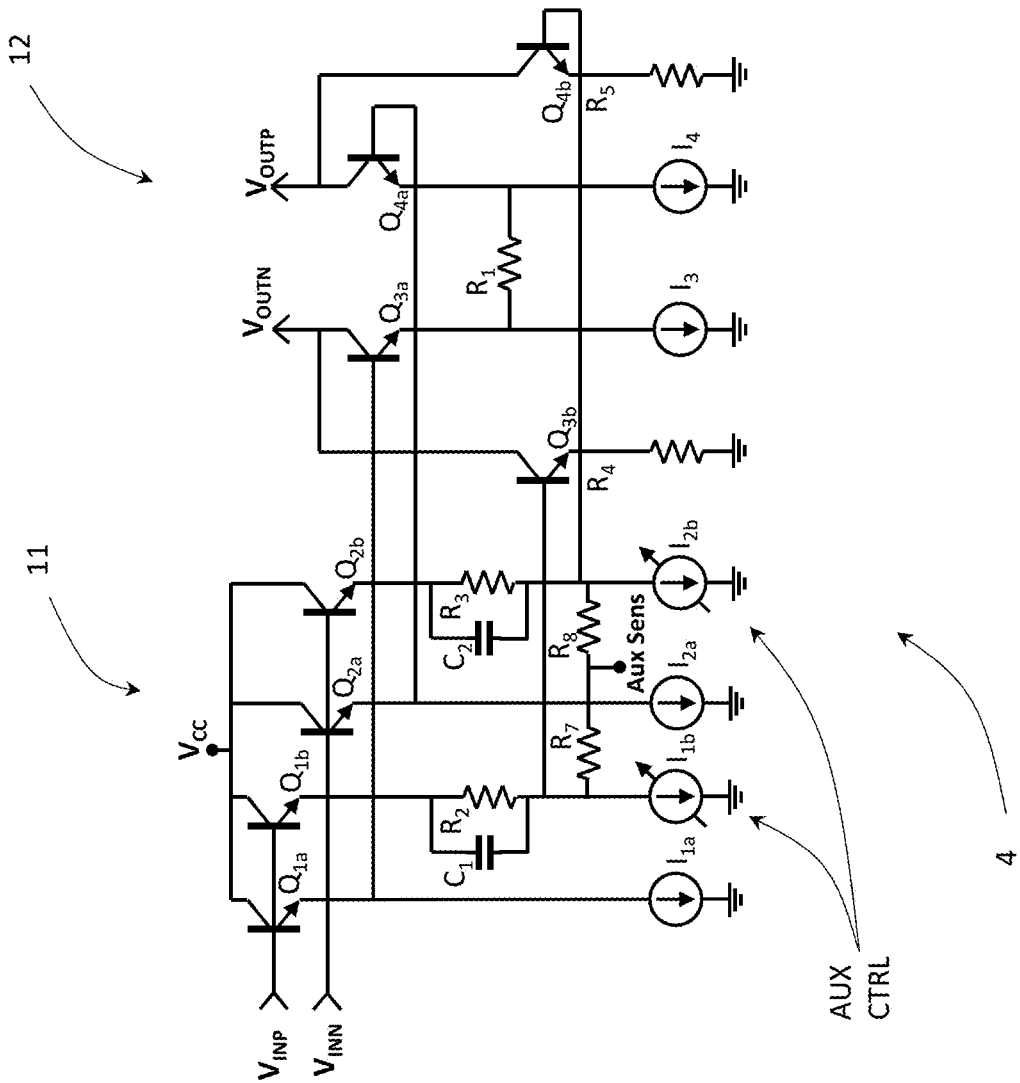
FIG. 4 is a schematic diagram of a final stage driver with extended linear output voltage of FIG. 1.

The embodiment in accordance with the present invention, illustrated in FIG. 4, includes the combination of degeneration resistors $R_1$ for extended linearity, and an auxiliary circuit, which may be comprised of auxiliary transistors $Q_{3b}$ and $Q_{4b}$, for extending the linear region of the last stage amplifier 4. The last stage amplifier 4 includes a voltage level shifter 11, and a differential pair circuit 12. The voltage level shifter receives the input voltages from the previous VGA $3_n$ at $V_{INP}$ and $V_{INN}$. Interconnection between the last amplifier stage 4 and the previous VGA stage $3_n$ requires the voltage level shifter 11 to shift the reference for the input electrical signals. Accordingly, the transistors $Q_{1a}$ and $Q_{2a}$ act as voltage buffers that shift the reference for the electrical signal. A first terminal, e.g. base or gate, of each buffer transistor $Q_{1a}$ and $Q_{2a}$ is connected to the voltage inputs $V_{INN}$ and $V_{INP}$, while the second and third terminals, e.g. collector or drain, and emitter or source, are connected between a voltage source $V_{CC}$ and respective current sources $I_{1a}$ and $I_{2a}$ for biasing the buffer transistors $Q_{1a}$ and $Q_{2a}$. The third terminal, e.g. emitter or source, of each buffer transistor $Q_{1a}$ and $Q_{2a}$ may be connected to a first terminal, e.g. base or gate, of the differential pair $Q_{3a}$ and $Q_{4a}$, respectively, whereby the differential pair $Q_{3a}$ and $Q_{4a}$ transform the input voltages to output currents, which are transformed to output voltages by the load, e.g. the optical modulator 7, at outputs $V_{OUTN}$ and $V_{OUTP}$. The second terminals of the differential pair $Q_{3a}$ and $Q_{4a}$ are connected to the outputs $V_{OUTN}$ and $V_{OUTP}$, and the third terminals of the differential pair $Q_{3a}$ and $Q_{4a}$ are connected to the a respective current source $I_3$ and $I_4$ for biasing the differential pair $Q_{3a}$ and $Q_{4a}$. The third terminals are also interconnected by the degeneration resistance $R_1$.

The differential pair circuit 12 may comprise two additional auxiliary transistors $Q_{3b}$ and $Q_{4b}$ that are biased off, but turn on once the input voltage exceeds a set value, e.g. a maximum input voltage $V_{max\_linear}$ of the differential pair $Q_{3a}$ and $Q_{4a}$ that produces a linear output. The auxiliary circuit, e.g. the auxiliary transistors $Q_{3b}$ and $Q_{4b}$, may be used to extend the linear region of the last stage amplifier 4, i.e. beyond that of the differential pair $Q_{3a}$ and $Q_{4a}$. First terminals, e.g. base or gate, of the auxiliary transistors $Q_{3b}$ and $Q_{4b}$ may be connected to the third terminals of auxiliary buffer transistors $Q_{1b}$ and $Q_{2b}$. Third terminals, e.g. source or emitter, of the auxiliary transistors $Q_{3b}$ and $Q_{4b}$ may be connected to ground as degenerated common-emitters, with resistors $R_4$ and $R_5$, respectively. The maximum input voltage $V_{max\_linear}$ may be determined experimentally for each differential pair or selected based on experience, e.g. a predetermined average, minimum or maximum of a plurality of previous devices.

Ideally, substantially matching the maximum input voltage of the differential pair $Q_{3a}$ and $Q_{4a}$ transfer function, i.e. the maximum input voltage $V_{max\_linear}$ that produces a linear output, to the voltage that turns on the auxiliary transistors $Q_{3b}$ and $Q_{4b}$ may extend the linear operation range of the differential pair-based amplifier circuit 12 used in the last stage amplifier 4. Accordingly, as the input voltage approaches the maximum input voltage for the differential pair $Q_{3a}$ and $Q_{4a}$, the auxiliary transistors $Q_{3b}$ and $Q_{4b}$ turn on.

Auxiliary transistor bias input voltage is obtained from the auxiliary voltage buffer circuit, e.g. comprised of auxiliary voltage buffer transistors $Q_{1b}$ and $Q_{2b}$, in parallel with the buffer transistors $Q_{1a}$ and $Q_{2a}$, respectively. First terminals, e.g. gate or base, of the buffer transistors $Q_{1a}$ and $Q_{2a}$ and the respective auxiliary buffer transistors $Q_{1b}$ and $Q_{2b}$ may be connected to the same node, and second and third terminals connected between the voltage source $V_{CC}$ and respective current sources $I_{1b}$ and $I_{2b}$. A DC voltage shift is introduced using shift resistors $R_2$ and $R_3$ in series with the respective third terminals of the auxiliary buffer transistors $Q_{1b}$ and $Q_{2b}$. Capacitors $C_1$ and $C_2$, which may be in parallel with shift resistors $R_2$ and $R_3$, increase the current from the auxiliary voltage buffer transistors $Q_{1b}$ and $Q_{2b}$, at increased frequencies.

For example, when the input signal $V_{INP}$ and $V_{INN}$ is larger than $V_{max\_linear}$, e.g. 0.75 $V_{in\_max}$ or 0.7 V, the input voltage, buffered by auxiliary voltage buffer transistors $Q_{1b}$ and $Q_{2b}$, respectively, and shifted by shift resistor $R_2$ and $R_3 \times$current source $I_{1b}$ and $I_{2b}$, respectively, raises the voltage of the first terminal, e.g. base, of the respective auxiliary transistors $Q_{3b}$ and $Q_{4b}$, which output a current that is added in parallel with differential pair transistor $Q_{3a}$ and $Q_{4a}$, respectively, thereby extending the linear region of the transfer function of the last stage amplifier 4 and the driver 1.

Process, voltage and temperature variation will change the voltage at which the auxiliary transistors $Q_{3b}$ and $Q_{4b}$ turn on, therefore, the voltage is made controllable by using the voltage drop in the shift resistors R2, R3. For this goal, the bias voltage of the auxiliary transistors $Q_{3b}$ and $Q_{4b}$ at their inputs in sensed by a controller Aux Bias using sensing resistors R7 and R8; this voltage is compared in comparator 11 with a reference voltage $V_{REF}$ while varying variable current sources $I_{1b}$ and $I_{2b}$ (see FIG. 1). Then a feedback loop with controller Aux Bias is used to vary the magnitude of the currents sources $I_{1b}$ and $I_{2b}$, such that the auxiliary transistors $Q_{3b}$ and $Q_{4b}$ turn on at the same desired input voltage magnitude, e.g. $V_{max\_linear}$.

The output of the auxiliary transistors $Q_{3b}$ and $Q_{4b}$, e.g. the second terminals, e.g. drain or collector, may be connect to the differential pair output currents, therefore, the total output current is the addition of the differential pair $Q_{3a}$ and $Q_{4a}$ and the auxiliary transistors $Q_{3b}$ and $Q_{4b}$.

Figure 5:
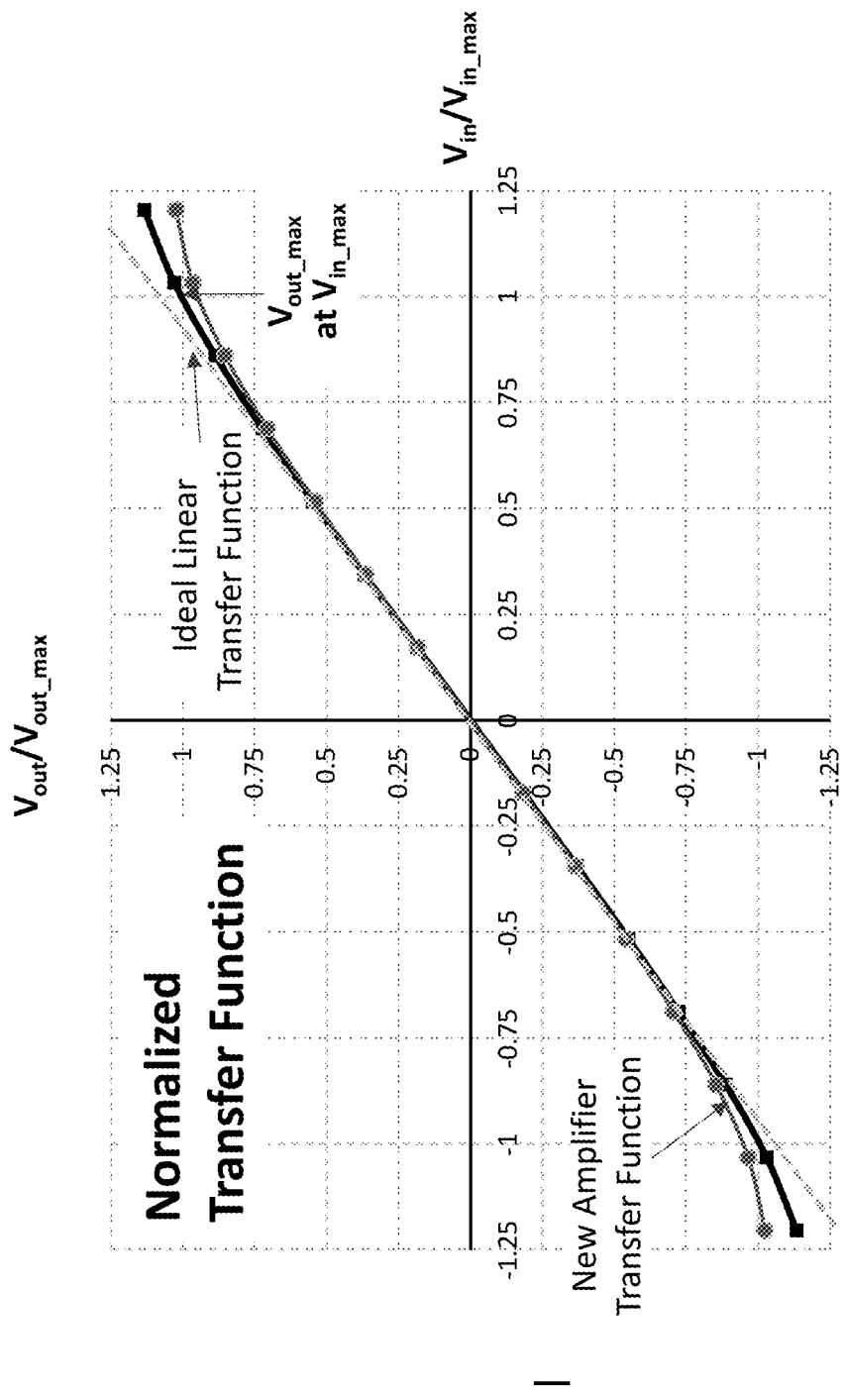
FIG. 5 is a graph of a normalized transfer function of the driver of FIG. 4.

The obtained transfer function of the last stage amplifier 4 of FIG. 4, as illustrated in FIG. 5, is more linear, therefore, the target output voltage ($V_{out\_max}$) for the modulator 7 is obtained at an input voltage $V_{in}$ equal to the target input voltage $V_{in\_max}$, i.e. with 15% less input voltage.

Figure 6:
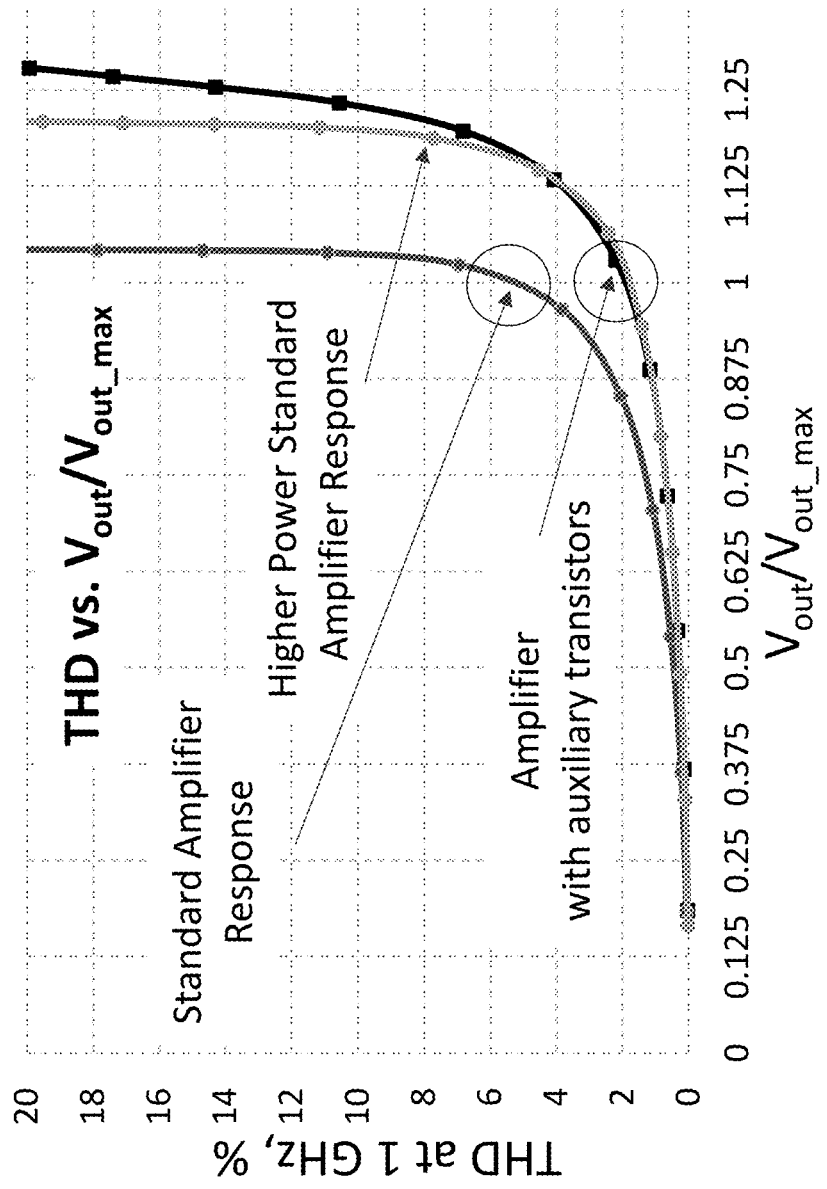
FIG. 6 is graph of THD vs normalized output voltage comparing conventional drivers with the driver of FIG. 4.

With reference to FIG. 6, the auxiliary transistors $Q_{3b}$ and $Q_{4b}$ extend the amplifier linear operation. For example, as illustrated by circles in FIG. 6, an output voltage equal to the target output voltage $V_{out\_max}$ has 5.2% total harmonic distortion (THD) in a standard implementation, while using the auxiliary transistors $Q_{3a}$ and $Q_{4a}$ reduces the THD to 1.8%. Furthermore, current in the last stage amplifier 4 may increase due to the auxiliary transistors $Q_{3a}$ and $Q_{4a}$ by 2.3%, when the output voltage $V_{out}$ equals the target output voltage $V_{out\_max}$, e.g. from 59.17 mA to 61.13 mA. If the standard amplifier is modified to obtain 1.8% THD, its current consumption may increase by 17.7%, e.g. from 59.17 mA to 69.17 mA.

Figure 7:
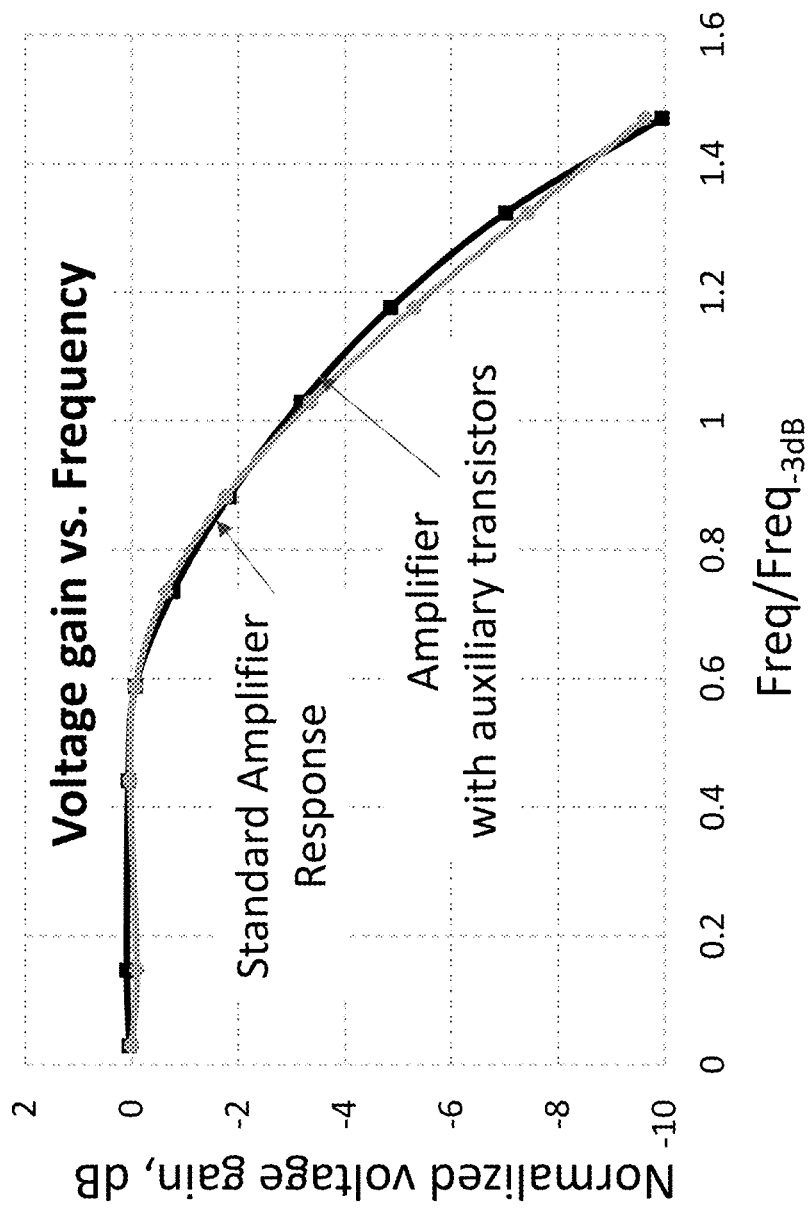
FIG. 7 is a graph of normalized voltage gain vs normalized frequency comparing conventional drivers with the driver of FIG. 4.

With reference to FIG. 7, any impact on the frequency response due to the use of the auxiliary transistors $Q_{3a}$ and $Q_{4a}$ may be minimized by shielding their capacitance from the output, e.g. using cascode transistors $Q_{3a}$ with $Q_5$ and $Q_{4a}$ with $Q_6$. In the illustrated example the second terminal, e.g. drain, of the transistor pair transistors $Q_{3a}$ and $Q_{4a}$, are connected with the third terminals, e.g. source, of the cascode transistors $Q_5$ and $Q_6$, while the first terminals, e.g. bases, of the cascode transistors $Q_5$ and $Q_5$ are both connected together and to a bias voltage, exemplified by a voltage source $V_{casc}$. The example in FIG. 8 uses cascode transistors $Q_5$ and $Q_6$, but other circuit techniques are within the scope of the invention.

Figure 8:
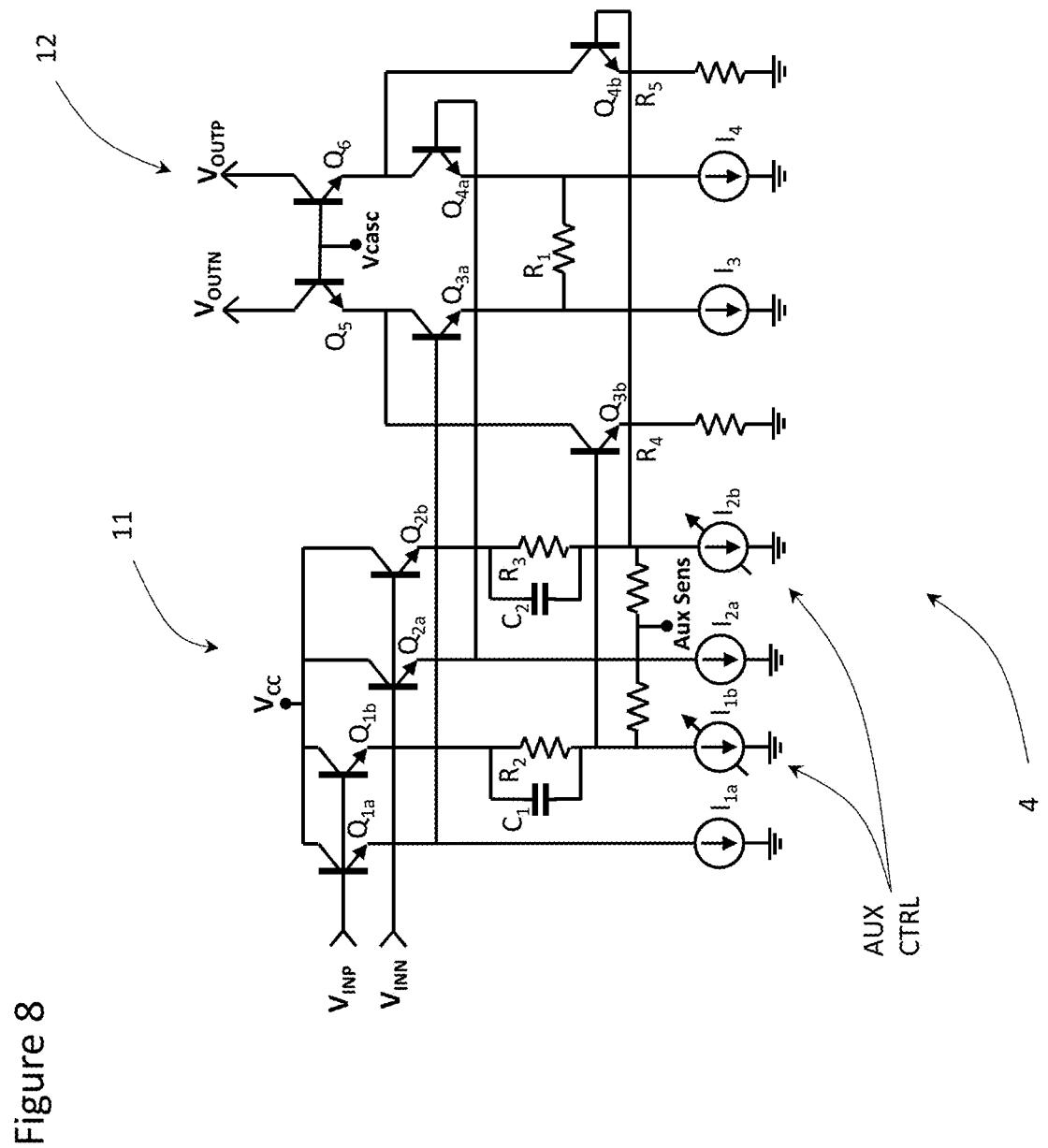
FIG. 8 is a schematic diagram of a final stage driver with cascode output stage and extended linear output voltage of FIG. 1.
Figure 9:
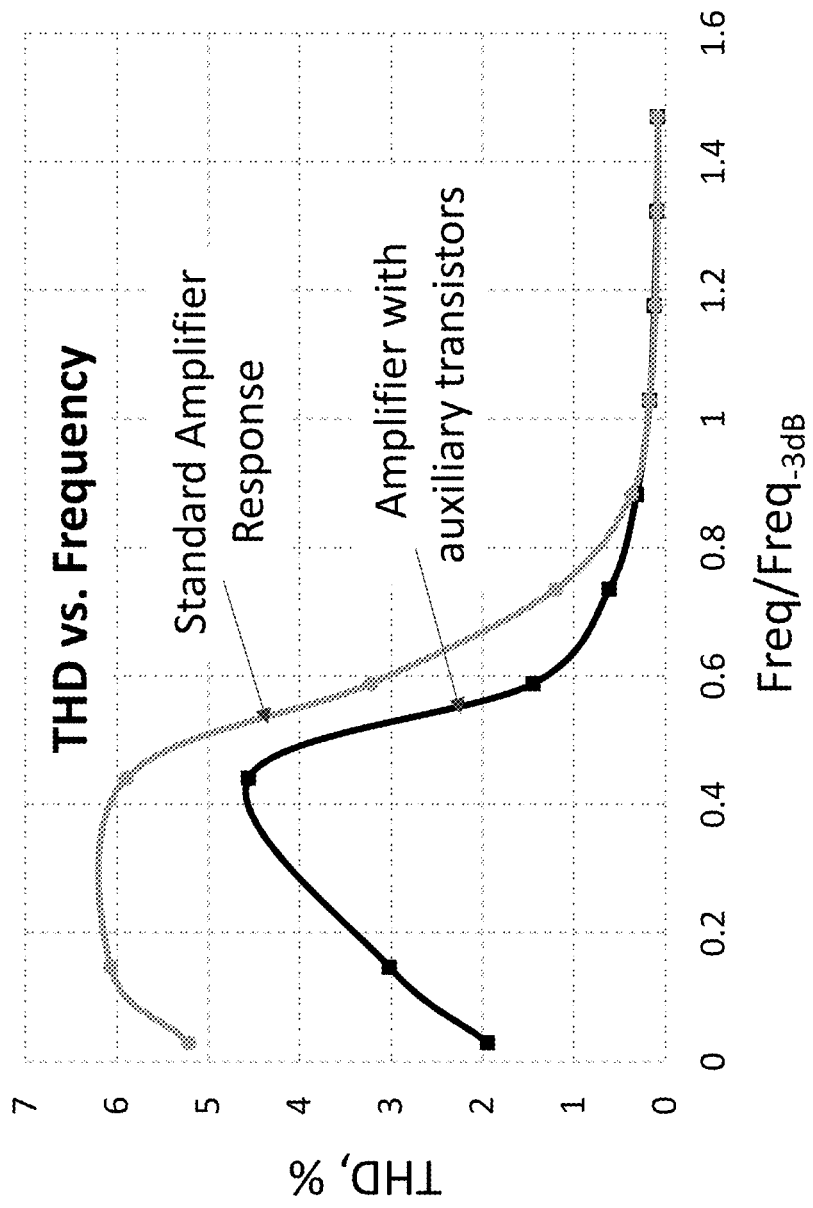
FIG. 9 is a graph of THD vs normalized frequency comparing conventional drivers with the driver of FIG. 4.

With reference to FIG. 8, THD varies across frequency; however, the auxiliary transistors $Q_{3a}$ and $Q_{4a}$ reduce overall THD across frequency, making the driver 4 of the present invention an ideal solution for broadband circuits.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:
1. A transmitter driver:
   a first input and a second input for inputting a differential input voltage;
   an amplifier stage for receiving the differential input voltage, including:
      a first transistor and a second transistor forming a first differential pair;
      a first output connected to the first transistor, and a second output connected to the second transistor for outputting a differential output voltage; and
      a first auxiliary transistor connected to the first transistor, and a second auxiliary transistor connected to the second transistor,
      a first degeneration resistor extending between the first transistor and the second transistors configured to extend a linear voltage range of the amplifier stage;
      wherein the first auxiliary transistor and the second auxiliary transistor are configured to turn on in response to the differential input voltage exceeding a set value, for increasing the differential output voltage, thereby extending a linear region of a transfer function of the amplifier stage.

2. The transmitter driver according to claim 1, further comprising a first degeneration resistor extending between the first transistor and the second transistors configured to extend a linear voltage range of the amplifier stage.

3. The transmitter driver according to claim 1, further comprising a buffer stage; wherein the buffer stage comprises a first buffer transistor connected to the first transistor, and a second buffer transistor connected to the second transistor.

4. A transmitter driver comprising:
   a first input and a second input for inputting a differential input voltage;
   an amplifier stage for receiving the differential input voltage, including:
      a first transistor and a second transistor forming a first differential pair;
      a first output connected to the first transistor, and a second output connected to the second transistor for outputting a differential output voltage; and
   a first auxiliary transistor connected to the first transistor, and a second auxiliary transistors connected to the second transistor,
   wherein the first auxiliary transistor and the second auxiliary transistor are configured to turn on in response to the differential input voltage exceeding a set value, for increasing the differential output voltage, thereby extending a linear region of a transfer function of the amplifier stage;

a buffer stage comprising a first buffer transistor connected to the first transistor, and a second buffer transistor connected to the second transistor; and wherein the buffer stage includes a third buffer transistor connected to the first buffer transistor and the first auxiliary transistor, and a fourth buffer transistor connected to the second buffer transistor and the second auxiliary transistor.

5. The transmitter driver according to claim 4, further comprising a first shift resistor connected to the third buffer transistor, and a second shift resistor connected to the fourth buffer transistor, for shifting the differential input voltage applied to the first auxiliary transistor and the second auxiliary transistor, wherein the first auxiliary transistor and the second auxiliary transistor are configured to turn on in response to the differential input voltage exceeding the set value, and output a current that is added in parallel to the differential output voltage, thereby extending the linear region of the transfer function of the amplifier stage.

6. The transmitter driver according to claim 5, further comprising a first capacitor and a second capacitor in parallel with the first shift resistor and the second shift resistor, respectively, configured to increase current from the third buffer transistor and the fourth buffer transistor at increased frequencies.

7. The transmitter driver according to claim 2, further comprising a second degeneration resistor connected to the first auxiliary transistor, and a third degeneration resistor connected to the second auxiliary transistor.

8. The transmitter driver according to claim 4, wherein the first buffer transistor and the second buffer transistor are configured to be respectively connected to a bias voltage.

9. The transmitter driver according to claim 4, further comprising a respective current source connected to each of the first buffer transistor, the second buffer transistor, the first transistor, and the second transistor.

10. The transmitter driver according to claim 9, wherein the respective current source connected to the first buffer transistor and the second buffer transistor, each comprise a variable current source for controlling a turn-on voltage of the first auxiliary transistor and the second auxiliary transistor.

11. The transmitter driver according to claim 10, further comprising a feedback loop configured to: sense a bias voltage of the first buffer transistor and the second buffer transistor respectively, compare the bias voltage to a reference voltage, and control the respective current sources connected to the first buffer transistor and the second buffer transistor to turn on the first buffer transistor and the second buffer transistor in response to the differential input voltage exceeding the set value.

12. The transmitter driver according to claim 1, further comprising a first cascode transistor and a second cascode transistor connected to the first transistor and the second transistor, respectively.

13. The transmitter driver according to claim 1, wherein the set value is about a maximum differential input voltage of the linear region of the transfer function of the amplifier stage.

14. A transmitter comprising:
a transmitter driver comprising:

a first input and a second input for inputting a differential input voltage;

an amplifier stage for receiving the differential input voltage, including:
a first transistor and a second transistor forming a first differential pair; and
a first output connected to the first transistor, and a second output connected to the second transistor for outputting a differential output voltage; and a first auxiliary transistor connected to the first transistor, and a second auxiliary transistors connected to the second transistor,
wherein the first auxiliary transistor and the second auxiliary transistor are configured to turn on in response to the differential input voltage exceeding a set value, for increasing the differential output voltage, thereby extending a linear region of a transfer function of the amplifier stage;

a laser for generating an optical signal; and a modulator for modulating the optical signal in accordance with the differential output voltage.

15. The transmitter according to claim 14, further comprising a buffer stage;

wherein the buffer stage comprises:

a first buffer transistor including a first terminal connected to the first input, and a third terminal connected to a first terminal of the first transistor; and a second buffer transistor including a first terminal connected to the second input, and a third terminal connected to a first terminal of the second transistor.

16. The transmitter according to claim 15, wherein the buffer stage includes:

a third buffer transistor including a first terminal connected to the first terminal of the first buffer transistor, and a third terminal connected to a first terminal of the first auxiliary transistor; and a fourth buffer transistor including a first terminal connected to the first terminal of the first buffer transistor, and a third terminal connected to a first terminal of the second auxiliary transistor.

17. The transmitter according to claim 16, further comprising a first shift resistor connected to the third terminal of the third buffer transistor, and a second shift resistor connected to the third terminal of the fourth buffer transistor for shifting the differential input voltage applied to the first terminals of the first auxiliary transistor and the second auxiliary transistors, whereby the first auxiliary transistor and the second auxiliary transistor are configured to turn on in response to the differential input voltage exceeding the set value, and output a current that is added in parallel to the differential output voltage, thereby extending the linear region of the transfer function of the amplifier stage.

18. The transmitter according to claim 14, wherein the set value is about a maximum differential input voltage of the linear region of the transfer function of the amplifier stage.

19. The transmitter driver according to claim 3, wherein the buffer stage includes a third buffer transistor connected to the first buffer transistor and the first auxiliary transistor, and a fourth buffer transistor connected to the second buffer transistor and the second auxiliary transistor.

20. The transmitter driver according to claim 4, wherein the set value is about a maximum differential input voltage of the linear region of the transfer function of the amplifier stage.

* * * * *